US008762122B1

(12) United States Patent
Cai et al.

(10) Patent No.: US 8,762,122 B1
(45) Date of Patent: Jun. 24, 2014

(54) METHODS FOR SYNCHRONIZED TRANSIENT-ENVELOPE AND EVENT-DRIVEN SIMULATION OF ELECTRONIC CIRCUITS

(75) Inventors: Qian Cai, Stewartsville, NJ (US); Dan Feng, Los Altos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 155 days.

(21) Appl. No.: 12/832,872

(22) Filed: Jul. 8, 2010

Related U.S. Application Data

(62) Division of application No. 11/941,899, filed on Nov. 16, 2007, now Pat. No. 7,761,279.

(51) Int. Cl.
*G06F 17/50* (2006.01)
*G06G 7/62* (2006.01)

(52) U.S. Cl.
USPC .............................................. 703/14; 703/13

(58) Field of Classification Search
CPC . G06F 17/5036; G06F 17/50; G06F 17/5031; G06F 17/505; G06F 2217/84
USPC ...................................................... 703/13, 14
See application file for complete search history.

(56) References Cited

U.S. PATENT DOCUMENTS

| 4,792,913 | A | | 12/1988 | Buckland et al. |
| 4,985,860 | A | * | 1/1991 | Vlach .............................. 703/17 |
| 5,481,484 | A | * | 1/1996 | Ogawa et al. .................... 703/14 |
| 5,995,733 | A | | 11/1999 | Roychowdhury |
| 6,110,217 | A | | 8/2000 | Kazmierski et al. |
| 6,374,189 | B1 | | 4/2002 | Sasai |
| 7,493,240 | B1 | | 2/2009 | Feng et al. |
| 7,720,660 | B2 | | 5/2010 | Bolcato et al. |
| 7,761,279 | B1 | | 7/2010 | Cai et al. |
| 2002/0049576 | A1 | * | 4/2002 | Meyer .............................. 703/14 |
| 2003/0009732 | A1 | | 1/2003 | Gullapalli |

OTHER PUBLICATIONS

Saleh et al, "Mixed-Mode Simulation and Analog Multilevel Simulation", The Springer International Series in Engineering and Computer Science vol. 279 1994 , ISBN: 978-1-4419-5144-1 (Print) 978-1-4757-5854-2 (Online).*
Scheffer,L; Lavagno,L.; Martin,G. "EDA for IC Implementation, Circuit Design, and Process Technology." 2006. pp. 15.8-15.23 CRC Press. Sound Parkway NW.
Cai, Q.; "Adaptive Solver for Cyclic Behavior of a Circuit"; U.S. Appl. No. 11/756,410, filed May 31, 2007, 30 pages.

(Continued)

*Primary Examiner* — David Silver
(74) *Attorney, Agent, or Firm* — Tobi C. Clinton

(57) ABSTRACT

In one embodiment of the invention, a method of simulating a circuit is disclosed including simulating an analog component of the circuit over a first simulation time period with a first envelope simulation; adaptively switching from simulating the analog component with the first envelope simulation to simulating the analog component with a transient simulation over a second simulation time period; and adaptively switching from simulating the analog component with the transient simulation to simulating the analog component with a second envelope simulation over a third simulation time period. The adaptive switching from the first envelope simulation to the transient simulation may be in response to the envelope simulation accuracy falling below a predetermined level of accuracy in comparison with a transient simulation or in response to the second simulation time period including expected digital transitions where one or more digital events may occur to change the analog input signals to the analog component.

30 Claims, 9 Drawing Sheets

(56) References Cited

OTHER PUBLICATIONS

Cai, Q; Partitioning an analog mixed-signal design to perform multi-rate simulation. U.S. Appl. No. 10/857,183, filed May 28, 2004, 62 pages.

Cai, Q. Selecting and using multiple rates during simulation of an analog mixed signal design. U.S. Appl. No. 10/857,265, filed May 28, 2004, 57 pages.

Cai, Q; Analog queue to synchronize a multi-rate simulation of an analog mixed signal design. U.S. Appl. No. 10/858,521, filed May 28, 2004, 38 pages.

Kundert, K.; Clifford, I. "Achieving Accurate Results With a Circuit Simulator", IEE Colloquium on SPICE: Surviving Problems in Circuit Evaluation, 1993, 49 pages.

Kundert, K. "Introduction to RF simulation and its application", Journal of Solid State Circuits, vol. 34, No. 9, Sep. 1999, pp. 1298-1319.

Agilent Technologies, "Harmonic Balance Simulation", Agilent Technologies, Sep. 2004, 202 pages.

Cadence, "Simulating Complex RF/Mixed-Signal Designs Using Virtuoso Ultrasim Full-Chip Simulator", Mar. 23, 2005, 12 pages.

Mei, T. 2006 Robust Envelope and Small-Signal Simulation Algorithms for Oscillatory Systems. Doctoral Thesis. UMI Order No. AAI3243360., University of Minnesota., Dec. 2006, 162 pages.

Agilent Technologies, "Circuit Envelope Simulation", Agilent Technologies, Sep. 2004, 50 pages.

Cai, Q; A Hierarchical approach to RF Mixed signal simulation. U.S. Appl. No. 11/941,904, filed Nov. 16, 2007, 36 pages.

Scheffer, Louis; Lavagno, Luciano; & Martin, Grant; "EDA for IC System Design, Verification, and Testing"; 2006; vol. I; pp. 16-1 through 16-3.

Abramovici, Miron; Breuer, Melvin; & Friedman, Arthur; "Digital Systems Testing and Testable Design"; 1990; pp. 42-43, 49-52.

Miczo, Alexander; "Digital Logic Testing and Simulation"; 1986; pp. 134-148.

Birnbaum, Mark D.; "Essential Electronic Design Automation (EDA)"; 2004; pp. 108-110.

Maxfiled, Clive; & Edson, Kuhoo Goyal; "EDA Where Electronics Begins"; 2001; pp. 49-51.

* cited by examiner

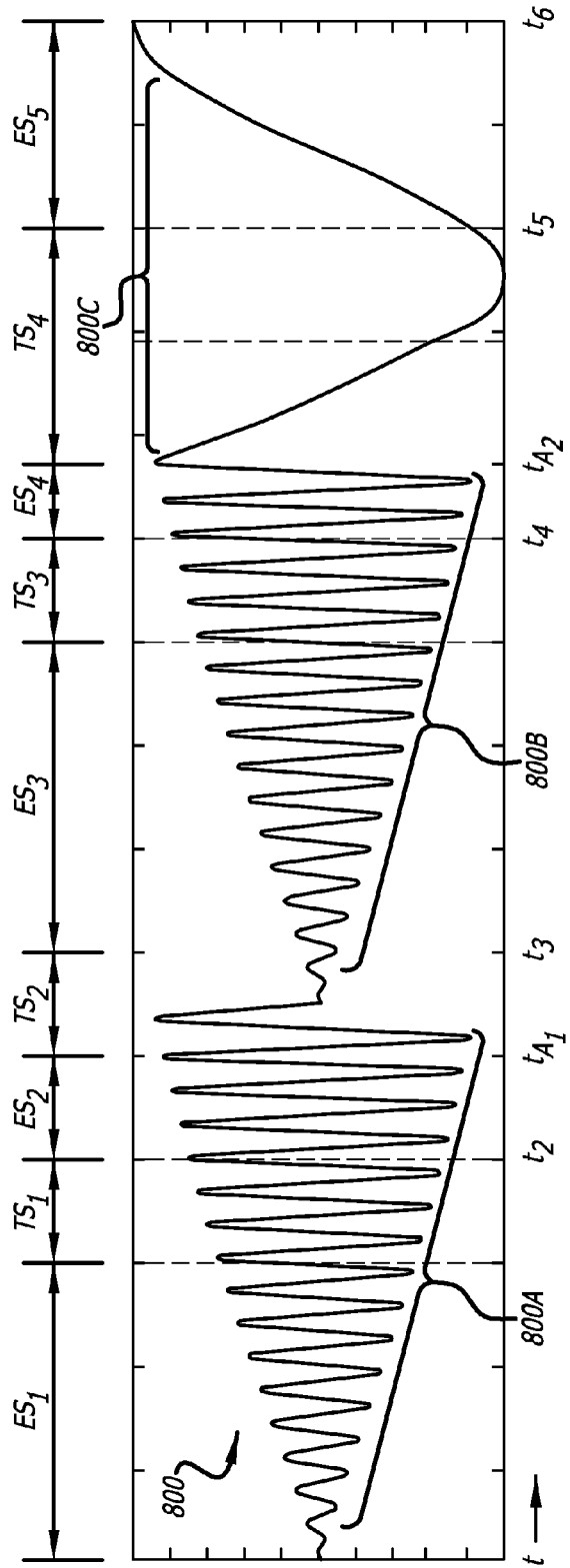
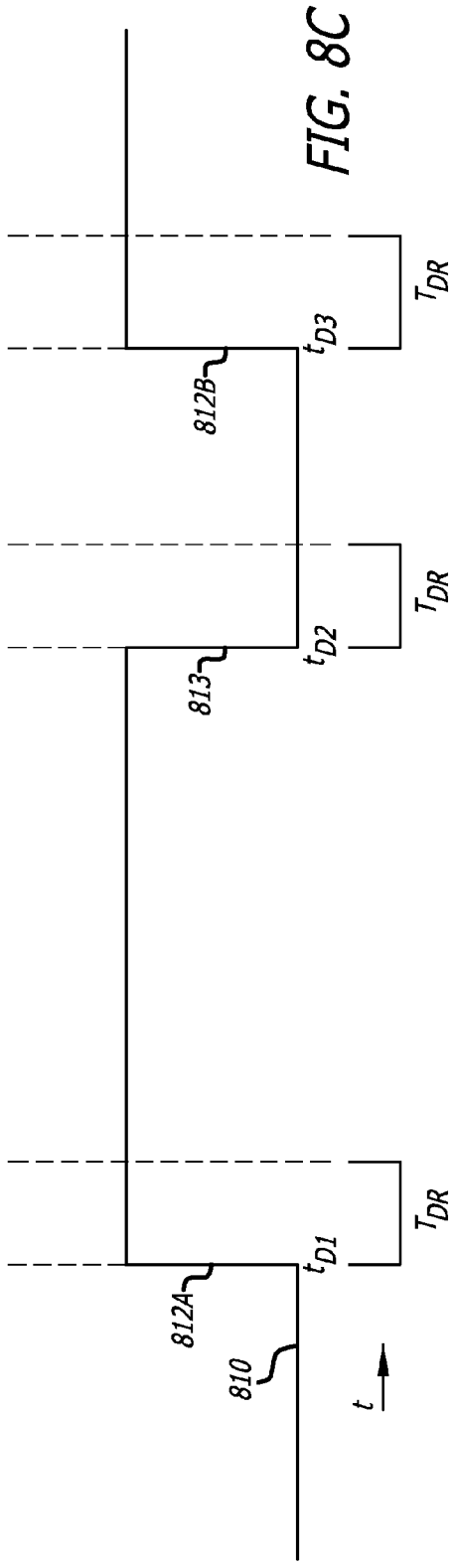

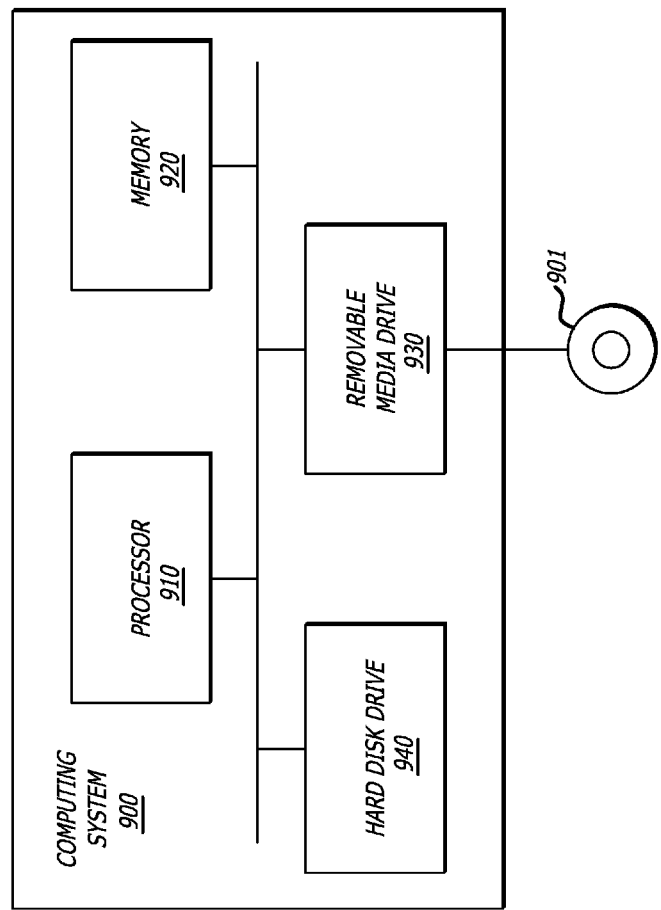

US 8,762,122 B1

METHODS FOR SYNCHRONIZED TRANSIENT-ENVELOPE AND EVENT-DRIVEN SIMULATION OF ELECTRONIC CIRCUITS

CROSS REFERENCE

This non-provisional United States (U.S.) patent application is a divisional application and claims the benefit of U.S. patent application Ser. No. 11/941,899 entitled SYNCHRONIZED TRANSIENT-ENVELOPE AND EVENT-DRIVEN SIMULATION OF ELECTRONIC CIRCUITS filed on Nov. 16, 2007 by inventors Qian Cai et al, now allowed.

FIELD OF INVENTION

The embodiments of the invention generally relate to the simulation of radio frequency (RF) circuits and subcircuits in mixed-signal integrated circuits.

BACKGROUND

One traditional approach to simulating electrical circuits is to use a version of the SPICE (Simulation Program with Integrated Circuit Emphasis) transistor level circuit simulator, originally created by the University of California, Berkeley in 1972, or one of its commercial variants such as SPECTRE™ by Cadence Design Systems, Inc., HSPICE™ by Synopsys, Inc., or ELDO™ by Mentor Graphics, Corp.

Referring now to FIG. 1, SPICE transistor level circuit simulators are well suited for simulating circuits that process lower frequency analog signals, such as illustrated by waveform 101 in FIG. 1. An analog signal is an electronic signal whose value varies continuously with time. However, SPICE transistor level circuit simulators are slow when simulating a circuit with modulated RF signals such as the waveform 102 illustrated in FIG. 1. RF signals are higher frequency analog signals and may be formed by modulating a low frequency analog signal with a repetitive high frequency modulating signal. Typically the low frequency analog signal modulates the magnitude, the phase, or the frequency of the repetitive high frequency signal.

SPICE transistor level circuit simulators are also relatively slow in simulating digital circuits. Waveform 103 in FIG. 1 illustrates an exemplary digital signal having a rectangular or square wave shape. Logic simulators are often preferred over SPICE transistor level circuit simulators for digital circuits. Logic simulators simulate digital circuits with digital signals faster than SPICE transistor level circuit simulators can because they represent the circuit at a higher level of abstraction and use a very fast simulation algorithm that is referred to as event driven simulation. The most popular logic simulators in use today for digital signals are either Verilog or VHDL simulators, both or which are very similar.

SUMMARY OF INVENTION

The embodiments of the invention are summarized by the claims that follow below.

BRIEF DESCRIPTION OF THE DRAWINGS

FIG. 8B is an exemplary waveform diagram of an analog signal that may be simulated over simulated time with a combination of transient simulations and envelope simulations.

FIG. 8C is an exemplary waveform diagram of a digital signal that may be simulated by a logic simulator and has digital events that may periodically occur.

FIG. 9 is a functional block diagram illustrating an exemplary computer system that may be used to perform some or all of the processes in accordance with a number of embodiments of the invention.

DETAILED DESCRIPTION

In the following detailed description of the embodiments of the invention, numerous specific details are set forth in order to provide a thorough understanding. However, embodiments of the invention may be practiced without these specific details. In other instances well known methods, procedures, components, and circuits have not been described in detail so as not to unnecessarily obscure aspects of the embodiments of the invention.

Introduction

A radio frequency (RF) circuit simulator and a logic simulator are combined together to form an RF mixed-signal simulator. The RF mixed-signal simulator can be used to efficiently simulate large heterogeneous RF circuits. The RF mixed-signal simulator receives a description of a circuit that contains transistor and analog behavioral descriptions of the analog and RF portions of the circuit and gate or digital behavioral descriptions of the digital part of the circuit; applies analog or RF circuit simulation techniques to the analog portion of the circuit and event-driven methods simulate the digital portion; and coordinates (e.g., synchronizes) the simulation of these portions to efficiently determine the behavior of the overall circuit as a whole.

Figure 2:
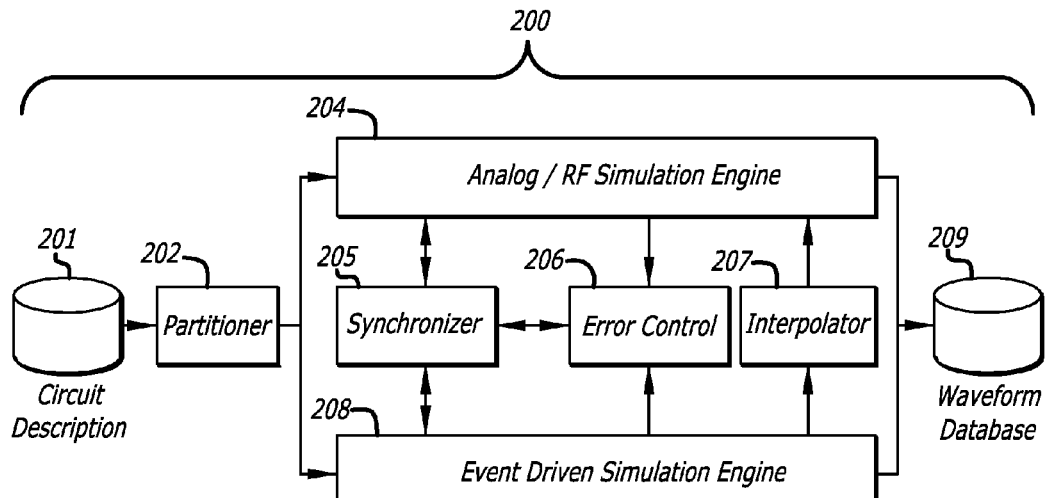
FIG. 2 is a functional block diagram of an RF mixed-signal simulator including an RF simulation engine.

Referring now to FIG. 2, an RF mixed-signal simulation system 200 is illustrated. The RF mixed-signal simulation system 200 receives a circuit description 201 in a database, simulates the circuit (e.g., circuit 300 in FIG. 3A) and generates signal waveforms that are stored in a waveform database 209. The system 200 includes a partitioner 202, an analog/RF analysis engine 204, a synchronizer 205, an error control block 206, an interpolator 207, and an event driven engine 208 coupled in communication together as shown.

Figure 3A:
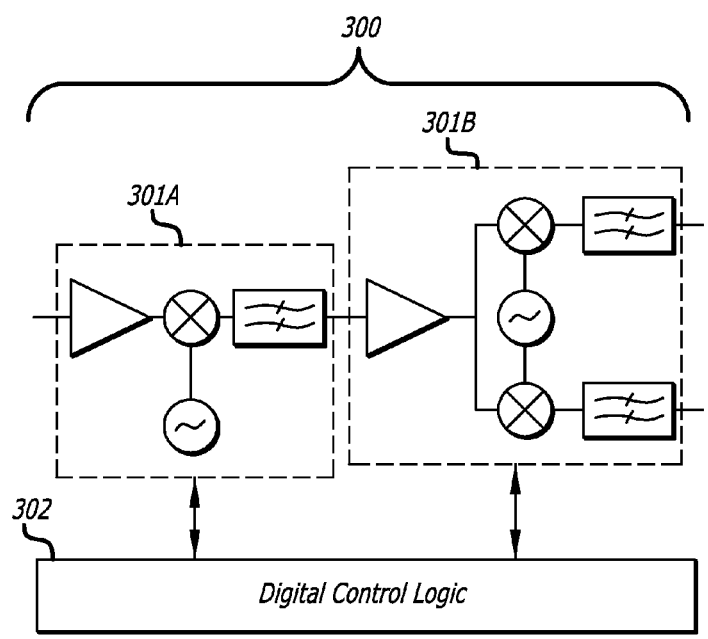
FIG. 3A is a block diagram of a circuit partitioned into an RF section and a logic section for simulation by an RF mixed-signal simulator.
Figure 3B:
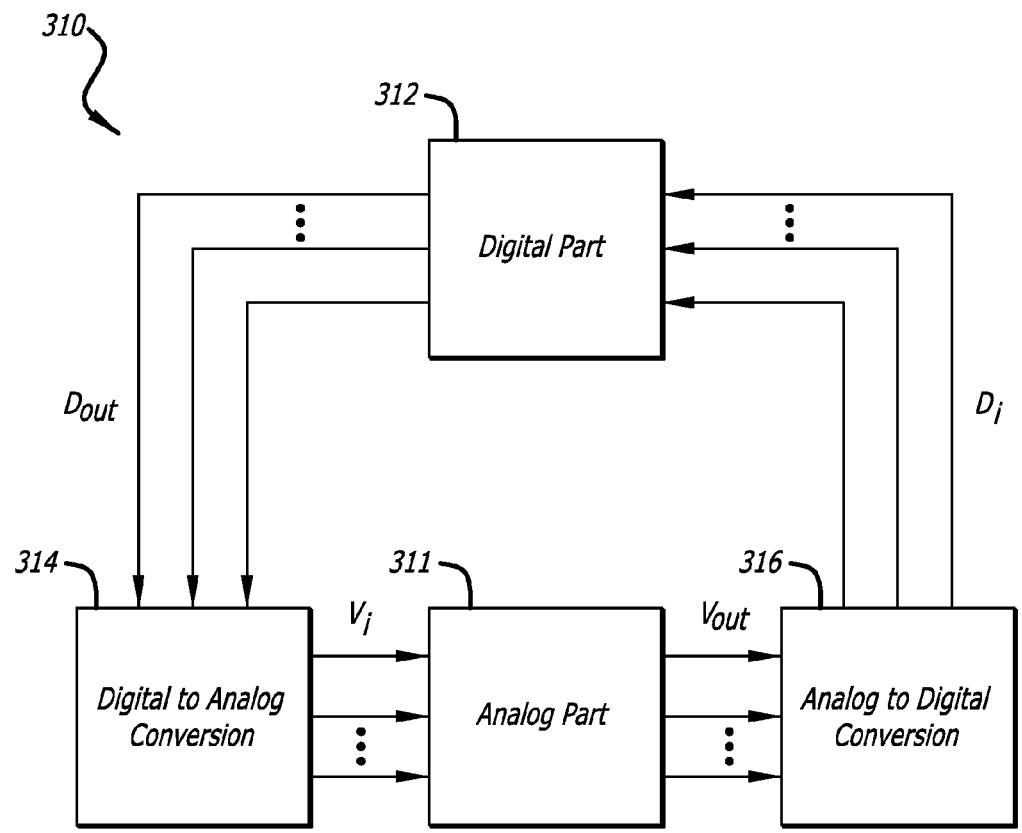
FIG. 3B is a block diagram of a general model for mixed-signal circuits.

Referring now to FIG. 3B, the RF mixed-signal simulation system 200 generally simulates mixed signal circuits that have both analog signals and digital signals being used within its circuit components. A model of a general mixed signal circuit 310 is illustrated in FIG. 3B. The general mixed signal circuit model 310 includes an analog circuit portion (analog part) 311 and a digital circuit portion (digital part) 312. The general mixed signal circuit model 310 may further include a digital-to-analog conversion (DAC) portion 314 coupled between one or more digital outputs Dout from the digital circuit portion (digital part) 312 and one or more of analog inputs Vi of the analog circuit portion (analog part) 311 to convert digital signals into analog signals. The general mixed signal circuit model 310 may further include an analog-to-digital conversion (ADC) portion 316 coupled between one or more of analog outputs Vout of the analog circuit portion (analog part) 311 and one or more digital inputs Di of the digital circuit portion (digital part) 312.

The digital circuit portion (digital part) 312 processes digital signals. The analog circuit portion (analog part) 311 processes analog signals, including any RF signals. The analog-to-digital conversion (ADC) portion 316 converts analog signals into digital signals so that they can be processed by the digital circuit portion (digital part) 312. The digital-to-analog conversion (DAC) portion 314 converts digital signals into analog signals so that they can be processed by the analog circuit portion (analog part) 311.

RF signals are a subset of analog signals. An RF signal has characteristics such that, if coupled to an antenna, an electromagnetic (EM) field is generated that can propagate through space or an electrical current is produced that can be received by a receiver circuit. RF signals are suitable for wireless communications having frequencies that cover a significant portion of the electromagnetic radiation spectrum, extending from nine kilohertz (9 kHz), the lowest allocated wireless communications frequency, to thousands of gigahertz (GHz), referred to herein as RF frequencies.

Referring now to FIG. 2 and FIG. 3A, the functions of the system 200 are now briefly described with reference to the mixed signal circuit 300 that processes RF signals and digital signals. The components that make up the mixed signal circuit 300 are identified as either being analog or digital by the partitioner 202, which sends the analog/RF components to the analog/RF simulation engine 204 and the digital components to the event-driven simulation engine 208. Components that have a continuous-time description will be sent to the analog/RF simulation engine by the partitioner. Resistors, capacitors, inductors, transistors, voltage sources, and current sources are examples of the type of components sent to the analog/RF simulation engine. The description for these components are typically either provided by the analog/RF simulation engine, or provided by the user in a high level description such as in the form of a Verilog-module. All other components will have an event-driven description that will either be provided by the event-driven simulation engine or provided in the form of a high level circuit description language (HDL) such a Verilog module. Logic gates, logic blocks such as counters and multiplexors, and even some analog blocks such as digital to analog converters (DAC) and analog to digital converters (ADC), are examples of the type of components sent to the event-driven simulation engine. These components will be sent to the event-driven simulation engine 208 by the partitioner.

Within the analog/RF simulation engine 204, either conventional transient analysis or a transient-envelope analysis is performed depending on the nature of the signal. If the signals all have the character of a periodic signal with a recently smooth modulation, as in 102, then some form of transient-envelope analysis is used. Otherwise, conventional transient analysis is used. The decision is generally made by the error control block 206 by observing the character of the signals within the circuit. Within the event-driven simulation engine event-driven simulation is used.

The transient simulation (either conventional or transient envelope) performed by the analog/RF simulation engine 204 is synchronized with event-driven simulations performed by the event-driven simulation engine 208 to assure the solution accuracy. The synchronizer 205, with guidance from the error controller block 206 synchronizes the analog/RF simulation engine 204 and the event-driven simulation engine 208.

The error controller block 206 performs smoothness checking to determine if the use of envelope simulation would be advantageous over conventional transient analysis or not. The error controller block 206 causes the system to adaptively switch from envelope simulation to transient simulation in response to the smoothness checking.

To complete an analysis of a mixed signal circuit, the analog/RF simulation engine 204 and the event-driven simulation engine 208 share signals of the mixed signal circuit with each other at common points or interface nodes.

Figure 4:
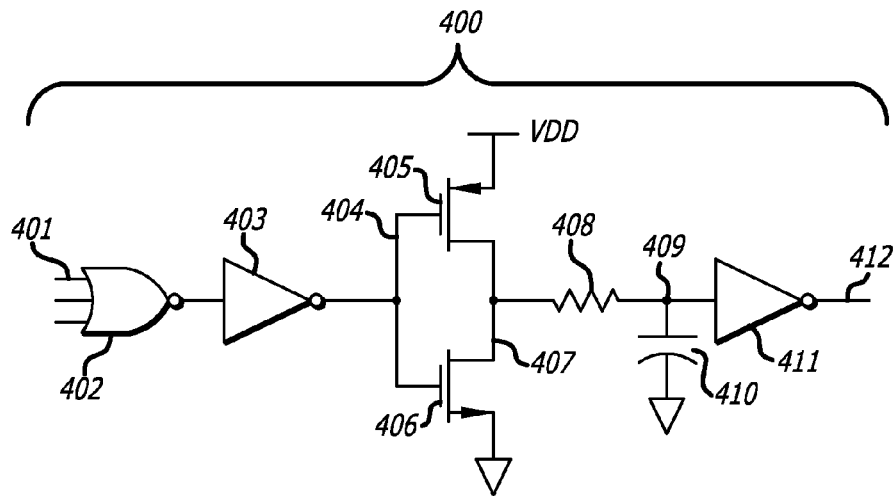
FIG. 4 is a schematic diagram of a simple circuit that contains both event driven components and continuous-time components.

Referring now to FIG. 4, an exemplary mixed-signal circuit 400 is illustrated including both event-driven (digital) components and continuous-time (analog) components. Even though the exemplary mixed-signal circuit 400 has one or more digital input signals 401 and a digital output signal 412, signals between the digital input 401 and the digital output 412 may be analog signals generated by continuous time driven components. The event-driven components of the exemplary circuit 400 may include a nor logic gate 401 and inverters 403, 411 coupled together as shown and to the continuous-time components. The continuous-time components include transistors 405-406, a resistor 408, and a capacitor 410 coupled together as shown and to the event driven components.

Nodes 404, 407, 409 are formed in the circuit 400 representing interconnection points between components. The one or more input nodes 401 and the output node 412 are purely event-driven nodes with event-driven components (e.g., nor gate 402 and inverter 411) connected to them and no continuous-time components connected to them. Node 407 is a purely continuous-time node with continuous-time components (e.g., transistors 405, 406 and resistor 408) connected to it. Nodes 404 and 409 have both continuous-time components (e.g., transistors 405, 406; resistor 408, capacitor 410) and event-driven components (e.g., inverter 403; inverter 411) connected to them. Nodes in a circuit coupled to both continuous-time components and event-driven components, such as nodes 404 and 409, may be referred to as interface nodes. At interface node 404, the inverter 403, an event driven component, drives the gates of the transistors 405-406, continuous-time components. At interface node 409, the transistors 405-406, resistor 408, and capacitor 410 form a continuous-time subcircuit that drives the gate input of inverter 411, an event-driven component.

To share signals at the interface nodes, the representation of the signals are converted between event driven signals and continuous time signals. At the interface nodes (e.g., interface node 404) in a signal flow from event driven components to continuous time components, the signal representation is converted from event driven signals to continuous time signals. At the interface nodes (e.g., interface node 409) in a signal flow from continuous time components to event driven components, the signal representation is converted from continuous time signals to event driven signals.

The interpolator 207 of FIG. 2 not only performs the conversion between event driven signals and continuous time signals at the interface nodes but also interpolates the signals over time. As the analog/RF simulation engine 204 generally does not evaluate the analog/RF circuit parts of the mixed signal circuit at the same time points as the event-driven simulation engine 208 evaluates the digital parts, the interpolator 207 interpolates the output signal values of one simulation engine at known simulation time points into input signal values at desired simulation time points for the other simulation engine. For example, the analog output signals $v_{out}$ from the analog circuit part 311 may be evaluated at T1 and T3 by the analog/RF simulation engine 204. However, the digital circuit part 312 desires that its digital signal inputs be known at time T2 so that the event-driven simulation engine 208 can properly simulate and determine the digital signal outputs from the digital circuit part 312. The interpolator 207 interpolates between the analog output signals evaluated at T1 and T3 into an analog output signal at the desired time T2 for the event-driven simulation engine 208.

Envelope Simulation

Figure 1:
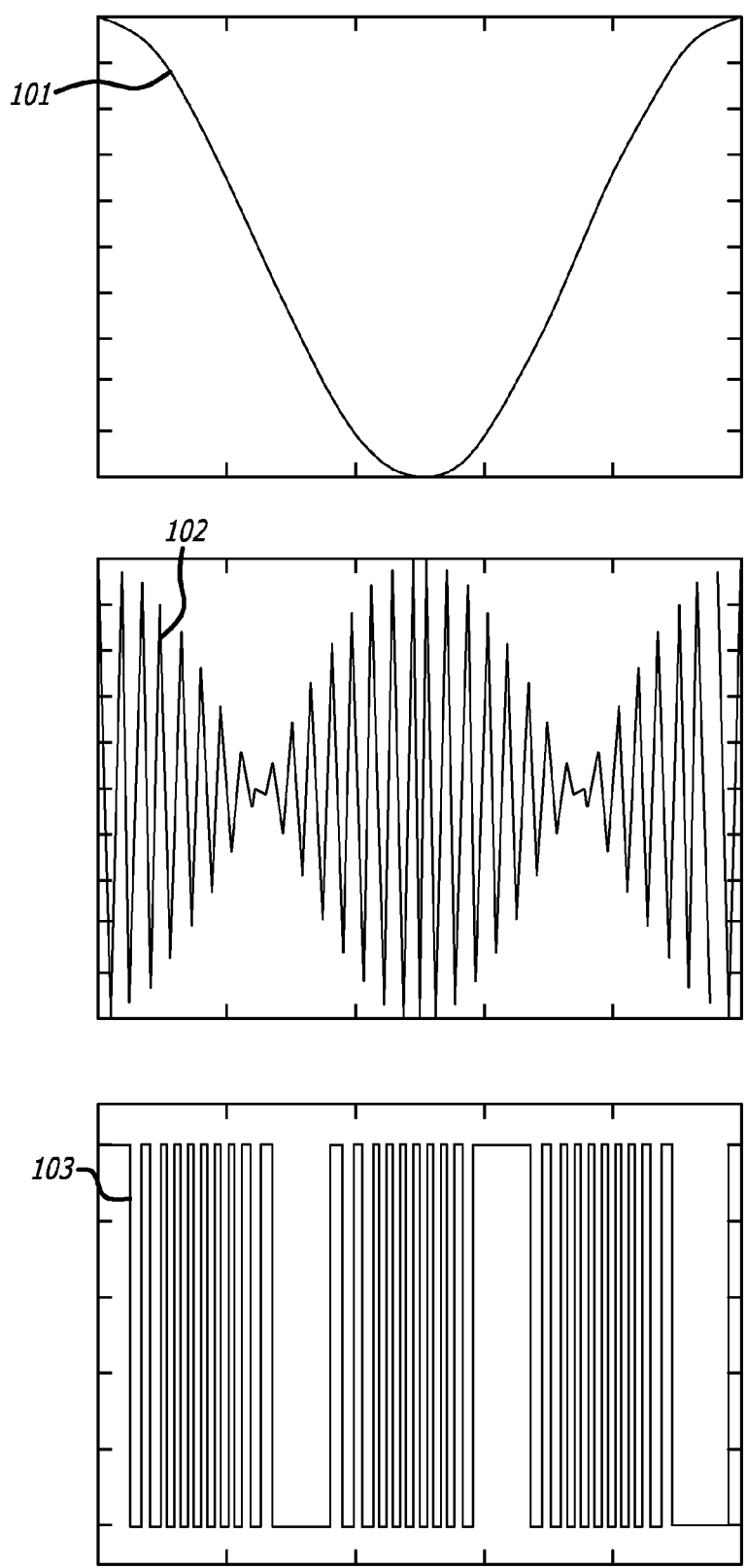
FIG. 1 illustrates waveforms of exemplary analog, RF, and digital signals.

Referring now to FIG. 2, envelope simulation is performed by the analog/RF simulation engine 204. Envelope simulation assumes that signals present in a circuit are slowly varying highly cyclic signals, such as signal 102 shown in FIG. 1. Notice that this signal is highly repetitive with one parameter, or at most a small number of parameters, that change slowly relative to the speed of the repetitive variation. In the signal 102 illustrated in FIG. 1, the amplitude is slowly varying. In other slowly varying highly cyclic signals, the offset, the phase, the frequency, or the amplitude and phase of any of the harmonics may slowly change relative to the repetitive variation.

Traditional methods of envelope simulation are described by Kundert. The analysis performed by traditional methods of envelope simulation may be referred to as transient-envelope analysis. Traditional methods of envelope simulation include a transient-envelope analysis based on shooting methods and a transient-envelope analysis based on harmonic balance. Alternatively, fast envelope simulation methods such as those described in U.S. patent application Ser. No. 11/756,410, entitled ADAPTIVE SOLVER FOR CYCLIC BEHAVIOR OF A CIRCUIT, filed by Yang and Cai, on May 31, 2007 which is incorporated herein by reference, may be used to perform envelope simulation. Envelope simulation further includes a transient-envelope analysis based on newton-shooting methods.

Adaptive Switching Between Transient Analysis Methods

Due to the nature of event driven signals, transitions in one or more signals occur at all events. When transitions occur in a signal driving or coupled into a continuous time component, such as a signal at node 404 illustrated in FIG. 4 coupled into transistors 405-406 for example, the resulting signal in the continuous-time domain contains breakpoints, or points where an input signal abruptly changes. These abrupt signal changes are simulated by conventional transient simulation (may also be referred to as normal transient simulation) (e.g., Spice-like transistor level simulation) in order to achieve accurate simulation results of a circuit. Apart from breakpoints, signals at continuous-time nodes are often smoothly varying RF signals and are efficiently simulated using envelope simulation to increase efficiency. Therefore, it desirable that the analog solver/simulator adaptively switch back and forth between fast envelope simulation and normal transient simulation on the fly for efficient and accurate mixed-signal simulation.

To maximize the simulation speed and reduce the time to simulate a mixed signal circuit, an envelope simulation is performed by the analog/RF simulation engine whenever possible if its level of accuracy permits. Conventional transient simulation is performed instead if envelope simulation fails to provide the desired level of accuracy. Envelope simulation is resumed once it is determined that envelope simulation can meet the desired level accuracy in simulation results. The level of accuracy in the simulation results may be determined by the error control block 206 illustrated in FIG. 2. Adaptive switching between conventional transient simulation and envelope simulation is automatically performed in response to the level of accuracy in simulation results. A robust smoothness checking scheme and a resolving procedure (also referred to as a resolving process) are provided to synchronize the digital simulation of digital components with the analog simulation of analog components. The smoothness checking procedure assures that simulation regions with sharp changes are simulated with conventional transient analysis.

Adaptive Switching System

Figure 7A:
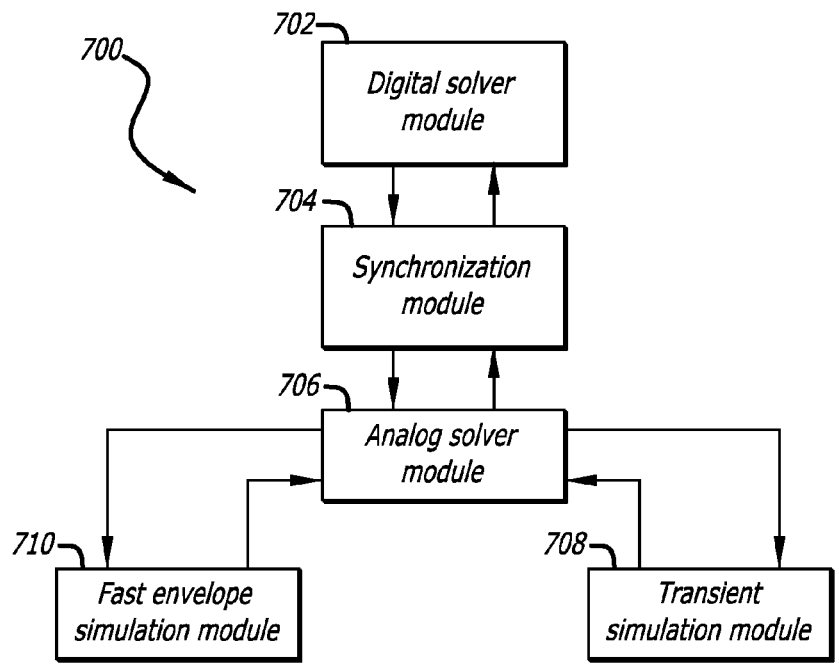
FIG. 7A is a functional block diagram of an RF mixed-signal simulator for simulating RF circuits and mixed signal circuits.

Referring now to FIG. 7A, a functional block diagram of an adaptive switching system of software modules for an RF analog mixed signal simulator 700 is illustrated. The RF analog mixed signal simulator 700 includes a digital solver module 702, a synchronization module 704, an analog solver module 706, a transient simulation module 708, and an envelope simulation module 710 configured in communication together as shown.

The analog solver module 706 performs analog simulations, including any RF simulation, of the one or more analog parts of a mixed signal integrated circuit. The digital solver module 702 performs digital simulations of the one or more digital parts of the mixed signal integrated circuit. The synchronization module 704 periodically synchronizes the analog simulations and the digital simulations of the mixed signal integrated circuit performed by the digital solver module 702 and the analog solver module 706, respectively. The synchronization module 704 saves the states of the simulations performed by the digital solver module 702 and the analog solver module 706 for a circuit.

The analog solver module 706 performs analog simulations of the analog part of a mixed signal integrated circuit using the transient simulation module 708 and/or the envelope simulation module 710. Over a period of simulation time, the analog solver module 706 may adaptively switch between using the transient simulation module 708 and the envelope simulation module 710 for a portion of the analog part of the mixed signal integrated circuit, such as an RF circuit. The analog solver module 706 saves the states and results of each simulation for a circuit as it adaptively switches between envelope simulation and transient simulation. The transient simulation performed by the transient simulation module 708 is assumed to be accurate. However, envelope simulation may not be accurate to provide simulation results for a circuit.

One or more conditions may be used to determine if the analog solver module 706 should simulate a circuit with envelope simulation by the envelope simulation module 710. A first condition is whether or not the one or more analog input signals to a circuit are sufficiently smooth over a period of time to perform envelope simulation. This process is referred to as smoothness checking and is described further herein. A second condition is whether or not the level of accuracy provided by the envelope simulation is at, above, or below a predetermined level desired by a user. The error checking module may use convergence checking in Newton iteration and local truncation error (LTE) checking after the Newton solution to provide a measure of accuracy. A third condition may be if a digital event occurs in response to the analog output of a circuit with too many waveforms of an envelope signal input being skipped.

Figure 8A:
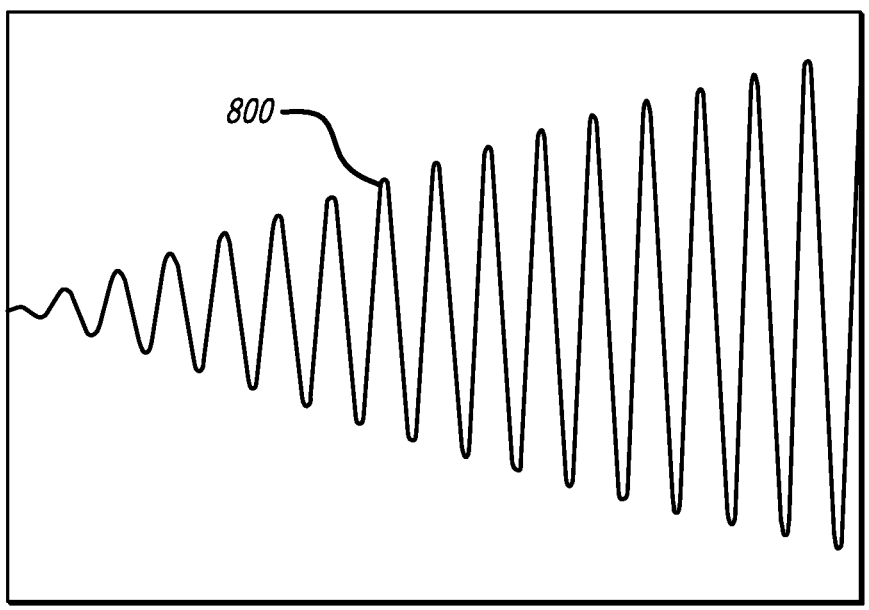
FIG. 8A is an exemplary waveform diagram of a highly cyclic signal such as generated by a circuit that is a good candidate for envelope simulation.

Referring now to FIG. 8A, envelope simulation is performed by the envelope simulation model 710. Envelope simulation assumes that signals present in a circuit are slowly varying highly cyclic signals, such as signal 800 shown in FIG. 8A that may be referred to as being an envelope signal. Notice that the envelope signal 800 is highly repetitive with one parameter, or at most a small number of parameters, that change slowly relative to the speed of the repetitive variation. For example, the parameter that is slowly varying in the envelope signal 800 illustrated in FIG. 8A is the amplitude of the signal from a small amplitude to a large amplitude. In other slowly varying highly cyclic signals, the offset, the phase, the frequency, or the amplitude and phase of any of the harmonics may slowly change relative to the repetitive variation.

In one embodiment of the invention, the envelope simulation module 710 is a fast envelope simulation module to perform fast envelope simulation methods such as those described in U.S. patent application Ser. No. 11/756,410, entitled ADAPTIVE SOLVER FOR CYCLIC BEHAVIOR OF A CIRCUIT, filed by Yang and Cai, on May 31, 2007, previously incorporated herein by reference. Traditional methods of envelope simulation are described in "Introduction to RF Simulation and Its Application" by Kundert, K. S., *IEEE J. Solid-State Circuits*, Vol. 34, September 1999, pp. 1298-1319. The analysis performed by traditional methods of envelope simulation may be referred to as transient-envelope analysis. Traditional methods of envelope simulation include a transient-envelope analysis based on shooting methods and a transient-envelope analysis based on harmonic balance. Envelope simulation further includes a transient-envelope analysis based on newton-shooting methods.

The fast envelope simulation is implemented as an event driven simulator to be consistent with normal transient simulation. With both being event driven simulators, the analog module may flexibly switch between fast envelope simulations and normal transient simulations. Fast envelope simulation is performed as much as possible whenever the desired level of accuracy allows. When the envelope simulation fails to obtain the desired level of accuracy, such as in digital simulation regions or other transition regions, the analog module may switch from envelope simulation to normal transient simulation to assure accurate simulation results or solutions. Digital simulation regions may periodically occur in a period of simulation time where one or more digital events may be expected to occur to change the analog input signals to an analog component of a mixed signal circuit.

Figure 7B:
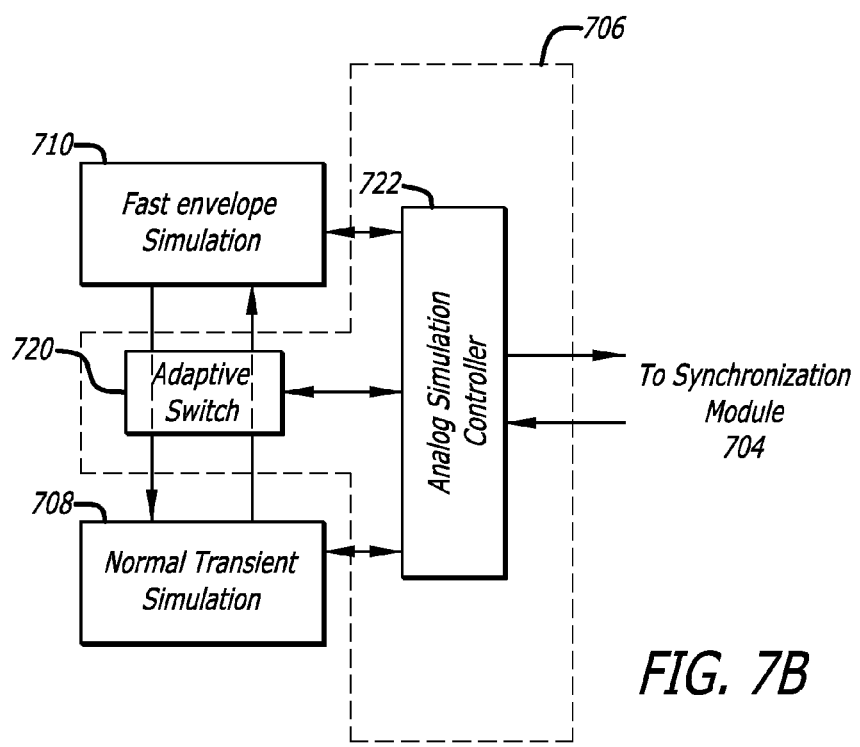
FIG. 7B is a functional block diagram of the analog solver module of the RF mixed signal simulator of FIG. 7A.

Referring now to FIG. 7B, the analog solver module 706 includes an adaptive switch 720 and an analog simulation controller 722 coupled in communication together and to the transient simulation module 708 and the envelope simulation module 710 as illustrated. The analog simulation controller 722 is further coupled in communication with the synchronization module 704.

The adaptive switch 720 in the analog solver module 706 adaptively switches between using the transient simulation module 708 and the envelope simulation module 710 for portions of the simulation of the analog part of the mixed signal integrated circuit. If the envelope simulation accuracy falls below a predetermined level of accuracy (e.g., ninety percent) or if the simulation time is in a digital transition region where a digital event may occur, the adaptive switch 720 may switch from the envelope simulation module 710 over to the transient simulation module 708 for analog simulation of the analog part of the mixed signal integrated circuit. If the current simulation time is not in a digital transition region where a digital event may occur and the analog simulation accuracy/tolerance permits a lower level of accuracy, the adaptive switch 720 may switch from the transient simulation module 708 over to the envelope simulation module 710 for analog simulation of the analog part of the mixed signal integrated circuit. If at later point of simulation time the envelope simulation accuracy fails or if the simulation is in a digital transition region where a digital event may occur, the adaptive switch 720 may switch back again from envelope simulation by the envelope simulation module 710 over to transient simulation by the transient simulation module 708.

Referring now to FIGS. 8B-8C, adaptive switching between transient simulation performed by the transient simulator 708 and envelope simulation by the envelope simulator 710 are now described with reference to the analog signal waveform 801 and the digital signal waveform 810.

Digital circuit events also referred to as digital events) where a digital signal changes that may be coupled to an analog circuit and cause changes in analog signals of the analog circuit. More careful simulation of the analog circuit may be made around digital circuit events. After a simulation start time, a digital event in the simulation of a digital circuit of a mixed signal circuit is associated with a digital event time along a simulation time line. For example, the digital signal waveform 810 has rising edges 812A and 812B and a falling edge 813 where the digital signal changes at digital event times $t_{D1}$, $t_{D3}$, and $t_{D2}$ respectively along a simulation time line. There may be a range or period of time, a digital transition region $T_{DR}$, where digital signals may change around (after and/or before) the digital event times $t_{D1}$, $t_{D3}$, and $t_{D2}$ of each of the respective edges 812A-812B, 813. More careful simulation of analog circuits may be made over each of the digital transition regions $T_{DR}$ in the simulation time line.

Analog circuit events also referred to as analog events) may occur where an analog signal abruptly changes. After the simulation start time, an analog event in the simulation of an analog circuit of a mixed signal circuit is associated with an analog event time along a simulation time line. For example, the analog signal waveform 801 has a first analog circuit event at a first analog event time $t_{A1}$ along the simulation time line between envelope waveforms 800A and 800B. A second analog event occurs for example at a second analog event time $t_{A2}$ along the simulation time line in the analog signal waveform 801 between the envelope waveform 800B and a gradual waveform 800C. More careful simulation of the analog circuit may be made around the analog events and the analog event times along the simulation time line.

The analog solver may adaptively switch back and forth between performing envelope simulation and transient simulation of the same analog circuitry as a result of the digital circuit events around the digital event times and the analog circuit events around the analog event times. For example, a first envelope simulation ES1 may be performed over a first simulation time period (first time region) from zero to the first digital event time $t_{Di}$. The analog solver may adaptively switch to a first transient simulation TS1 over a second simulation time period (second time region), a digital transition region $T_{DR}$, from the first digital event time $t_{D1}$ to a simulation time $t_2$. The analog solver may adaptively switch to a second envelope simulation ES2 over a third simulation time period (third time region), if conditions permit, from the simulation time $t_2$ up to a simulation time at or just before the first analog event time $t_{A1}$. At or just before the first analog event time $t_{A1}$, the analog solver may simulate the analog circuit with a second transient simulation TS2 over a time period up to a time t3 where it can adaptively switch back to envelope simulation.

Similarly, a third envelope simulation ES3 may be performed over another simulation time period from the time $t_3$ to the second digital event time $t_{D2}$. The analog solver may adaptively switch to a third transient simulation TS3 over another simulation time period, a digital transition region $T_{DR}$, from the second digital event time $t_{D2}$ to a simulation time $t_4$. The analog solver may adaptively switch to a fourth envelope simulation ES4 over another time period, if conditions permit, from the simulation time $t_4$ up to a simulation time at or just before the second analog event time $t_{A2}$.

As a result of the third digital event time $t_{D3}$ being close in time to the second analog event time $t_{A2}$, the analog solver may simulate the analog circuit with a fourth transient simulation TS4 over a time period (including a digital transition region $T_{DR}$) from at or just before the second analog event time $t_{A2}$ up to a time $t_5$ where it may adaptively switch back to envelope simulation, if conditions permit. Assuming the conditions are right, the analog solver may adaptively switch to a fifth envelope simulation ES5 over another time period, from the simulation time $t_5$ through to the simulation time $t_6$.

Additionally, an analog output signal may be fed back or forward coupling into a digital circuit and perhaps cause digital signal changes resulting in a new digital event. Detection of new digital events may be made by the synchronizer so that a mixed signal circuit is properly simulated.

Simulation Synchronization

The synchronization scheme between analog simulations and digital simulations may determine the success or failure of an analog mixed signal (AMS) simulator. If the digital and analog simulations of the AMS simulator are not properly synchronized, the solution accuracy and the simulation efficiency may suffer. A smoothness checking scheme and a resolving procedure (also referred to as a resolving process) are used by the embodiments of the invention to provide robust synchronization between digital and analog simulations. Smoothness checking and resolving are described herein and also in U.S. patent application Ser. No. 11/941,904 entitled SYNCHRONIZED ENVELOPE AND TRANSIENT SIMULATION OF CIRCUITS filed on Nov. 16, 2007 by inventors Qian Cai et al. which is incorporated herein by reference.

Figure 5:
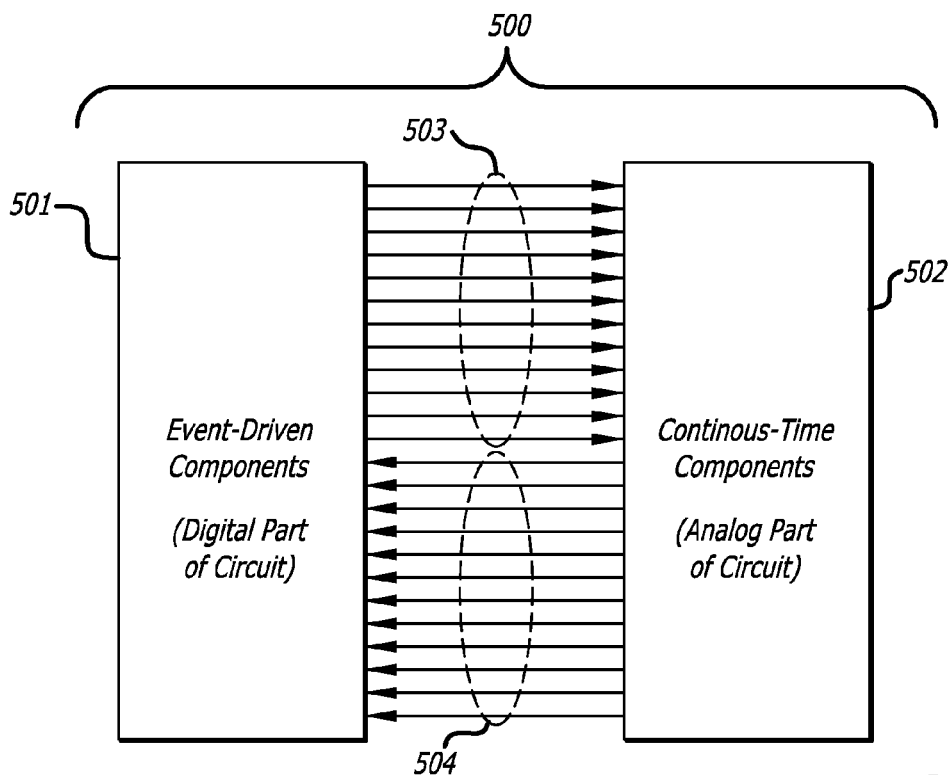
FIG. 5 is a block diagram of a mixed-signal circuit that shows the subcircuit of event-driven components, the subcircuit of continuous-time components, and the interconnect between the two.

Referring now to FIG. 5, a complete circuit 500 is partitioned into a subcircuit of event-driven components (digital part) 501 and a subcircuit of continuous-time components (analog part) 502. These components 501-502 are interconnected at interface nodes 503-504. At some of the interface nodes 503, the event-driven components 501 drive the continuous-time components 502. From the perspective of the continuous-time subcircuit 502, the interface nodes 503 are considered input nodes or input ports. At other interface nodes 504, the continuous-time components 502 drive the event-driven components 501. The interface nodes 504 are considered output nodes or output ports from the perspective of the continuous-time components 502.

Assume that there are K input nodes or ports 503 to the continuous-time components 502 of the circuit and their state variables are represented by $v_1, v_2, \ldots, v_K$. The smoothness of the signals on the K input ports are examined by comparing values of their state variables and time derivatives of the state variables at previous and current time points.

Let $t_a$ be the time of the last accepted evaluation point for the continuous-time simulation engine and $t_c$ be the time of the current evaluation point. The analog input voltages $v_i$ for each of K input ports coupled into the analog part of the circuit are analyzed for sharp changes from the last accepted evaluation time $t_a$ to the current simulation time $t_c$. Changes for analog input voltages $v_i$ for each of K input ports may be determined using equations (1) and (2) as follows:

$$\Delta v'_i = \left| \frac{dv_i}{dt} \right|_{t_c} - \frac{dv_i}{dt} \bigg|_{t_a} \right|  \; i = 1, 2, \ldots, K \quad (1)$$

$$\Delta v_i = |v_i(t_c) - v_i(t_a)| \; i=1, 2, \ldots, K \quad (2)$$

Let $\epsilon'$ and $\epsilon$ be the user defined tolerances allowed for a waveform smoothness criteria SW. The selection of values of $\epsilon'$ and $\epsilon$ depend upon the simulation accuracy desired. For example, $\epsilon'$ and $\epsilon$ may be set to provide a tolerance of simulation accuracy over a range of one to five percent. The waveform smoothness criteria $SW_i$ may be defined as a logical and operation of $\Delta v_i$ and $\Delta v_i'$ as follows $$SW_i = \Delta v_i < \epsilon \text{ AND } \Delta v'_i < \epsilon' \text{ for } i=1, 2, \ldots, K \quad (3)$$

If $SW_i$ for all i=1, 2, . . . , K are true, then the waveform is considered smooth, which means that there are no digital events changing the input signals at the input ports 503 of the continuous time components 502.

The digital event time and the analog event time are compared. If an analog event time is later than a digital event time, then the analog solver resolves the analog simulation of the analog circuit up to the digital event time. The analog solver resolves the simulation results or solutions of the analog parts of the mixed signal circuit up to the digital event time.

If the analog event time is earlier than the digital event time, the results of the analog simulation at the analog event time can be pre-accepted to determine if its results cause a new digital event in the digital circuit to occur. The analog solver can perform simulation at the current evaluation time $t_c$, pre-accept the solution or results (referred to as a pre-accepted solution or pre-accepted results), and then send the state variable values of the output ports 504 to the event-driven engine to evaluate the event driven components 501.

If the new signal values on the output ports 504 do not cause any digital events to occur on the input ports 503 that would cause a smoothness checking failure, the analog/RF simulation can continue to the time of the next evaluation using either envelope or conventional transient simulation. Thus, if no new digital event occurs at the analog event time then the pre-accepted solution of the analog simulation at the analog event time can by accepted and saved (also referred to as being fully accepted).

However, if the smoothness checking fails, the new signal values on the output ports 504 cause a digital event to occur on the input ports 503. This means that the time step taken by the continuous-time solver is too large and should be reduced. The continuous-time solver needs to discard the pre-accepted solution or the pre-accepted results at the current time point $t_c$, reduce the time step, and re-simulate the analog part. This process of discarding the pre-accepted solution at the current time point $t_c$, reducing the time step, and re-simulating the continuous time components (analog part) 502 to obtain another solution and other results may be part of the resolving process.

During synchronization, the continuous-time (analog) solver is typically always ahead of the event-driven (digital)

solver up to the next digital event time point $t_d$, because it can model waveforms and skip time. If the simulation in the continuous-time (analog) solver skips over or passes the next digital event time point $t_d$, the continuous-time (analog) solver has to rollback and perform a resolving process up to digital event time point $t_d$ in order to allow for both the event-driven solver and the continuous-time solver to synchronize their solutions at digital event time point $t_d$. If envelope simulation is performed by the analog solver before a simulation solution is found from it by the resolving process, a simulation solution may be obtained at an interpolation time point $t_p$ from the envelope simulation using interpolation (see the description of interpolator 207 herein), just before the digital event time point $t_d$. The system may then adaptively switch to normal transient simulation and generate simulation solutions of a circuit over the range of time from the interpolation time point $t_p$ to the digital event time point $t_d$. After the digital event time point $t_d$, normal transient simulation continues until conditions are satisfied where the continuous-time (analog) solver can adaptively switch back to envelope simulation.

Figure 6:
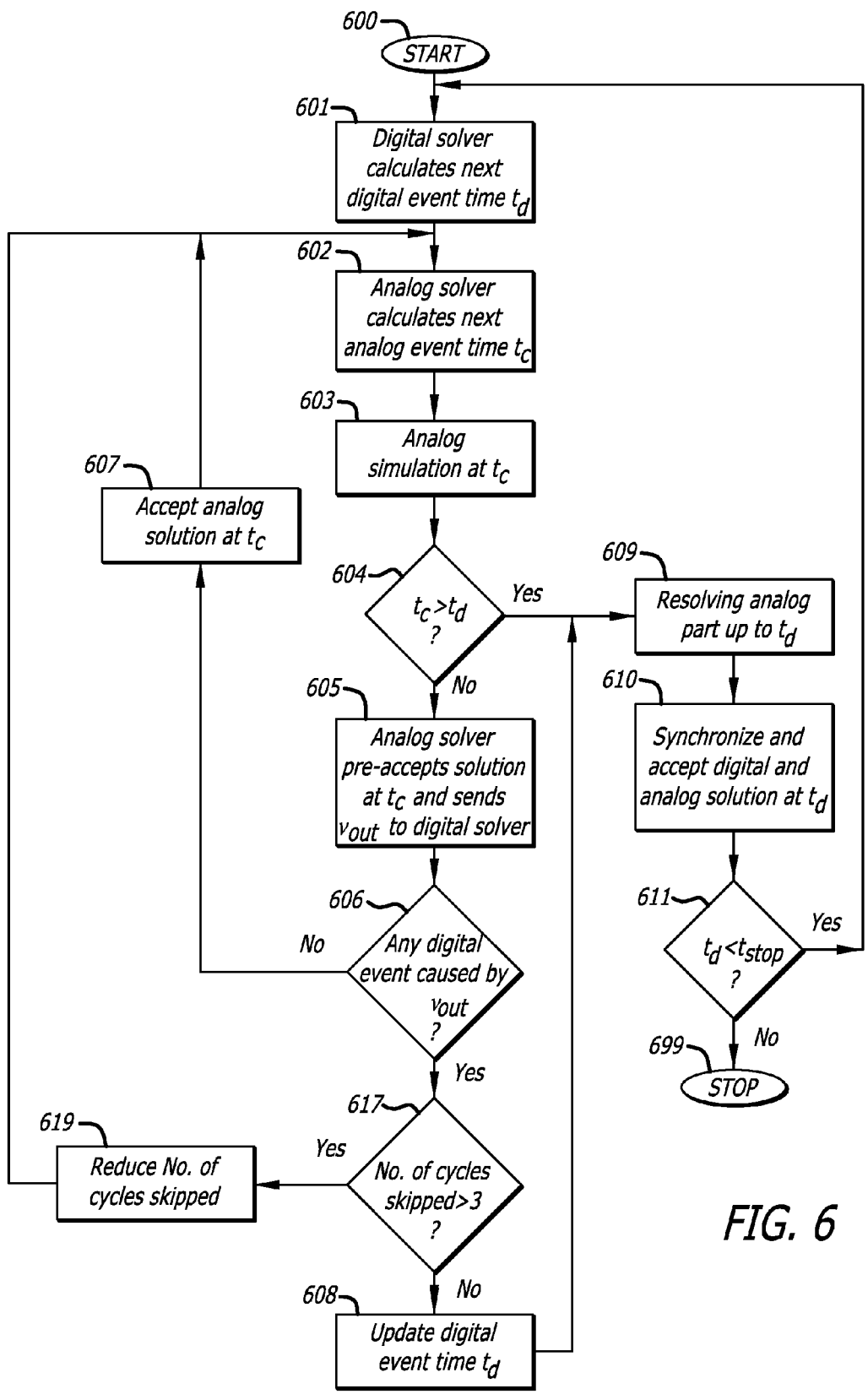
FIG. 6 is an exemplary flow chart diagram of performing RF mixed-signal simulation on an RF circuit with an RF mixed-signal simulator.

FIG. 6 illustrates a flow diagram of the synchronization and adaptive switching process. The process begins at the start process block 600 and then goes to process block 601.

At process block 601, RF mixed-signal simulation starts with the digital event-driven solver engine calculating the next digital event time $t_d$. The next digital event time $t_d$ is passed to the analog solver. The process then goes to block 602.

At process block 601, the analog solver calculates the next analog event time $t_c$. The process then goes to block 603.

At process block 603, the analog solver performs an analog simulation of analog circuitry with envelope simulation for smooth regions (e.g., periods of simulation time with envelope waveforms) up to the next analog event time $t_c$ with input signals passing smoothness checking. Otherwise for transition regions (e.g., periods of simulation time with digital events expected to occur) and when input signals cannot pass smoothness checking, normal transient simulation is performed by the analog solver up to the next analog event time $t_c$. The process then goes to block 604.

At process block 604, a determination is made if the next analog event time $t_c$ is greater (later) than the next digital event time $t_d$. If so, the process goes to block 609. If not, the process goes to block 605.

At process block 609, assuming that the next analog event time $t_c$ is greater than the next digital event time $t_d$, the analog solver resolves the simulation results or solutions of the analog parts of the mixed signal circuit up to the next digital event time $t_d$. The process then continues onto block 610.

At process block 610, the digital solver and the analog solver are synchronized and both the digital and analog simulation results at the digital event time $t_d$ are accepted and saved such as in a simulation file. The process then continues on to block 611.

At process block 611, a determination is made if the digital event time $t_d$ is less than a stop time $t_c$. If not, the process goes to block 699 and stops. If the digital event time $t_d$ is less than a stop time $t_c$ then the process loops back to process block 601 to continue simulating the mixed signal circuit.

As described previously with reference to process block 604, if the next analog event time $t_c$ is not greater than (i.e., less than or equal to) the next digital event time $t_d$ the process goes to block 605. In this case, the next analog event time $t_o$ is earlier than or the same as the next digital event time $t_d$.

At process block 605, the analog solver pre-accepts the simulation results at the analog event time $t_c$. The analog solver further sends the simulation results for the analog outputs Vout to the digital solver. The process then continues to block 606.

At process block 606, a determination is made as to whether or not the analog outputs Vout from the analog parts of the mixed signal circuit have caused any new digital event to occur at the analog event time $t_c$. If no new digital event has occurred, the process goes to block 607. If a new digital event has occurred due to the value of the analog outputs Vout, the process goes to block 617.

At process block 607, responsive to no new digital event occurring, the analog solver accepts the simulation results of the analog part of the circuit at the analog event time $t_c$. The process then loops back to process block 602 to simulate the analog part of the circuit with the analog solver for the next analog event time $t_c$.

As described previously with reference to process block 606, if a new digital event has occurred due to the value of the analog outputs Vout, the process goes to block 617.

At process block 617, a determination is made if the number of waveform cycles skipped by performing envelope simulation is greater than a predetermined number, such as three for example. If the skipped number of cycles is greater than the predetermined number, then the process goes to block 619. If the skipped number of cycles is less than or equal to the predetermined number, then the process goes to block 608.

It is expected that the number of skipped waveform cycles of an envelope waveform will at least be three if envelope simulation is to be more efficient in simulating an analog circuit than transient simulation. If a digital event was caused by the analog output using envelope simulation, it may have been caused by the large number of skipped cycles. Block 617 checks to see if a large number of waveform cycles were skipped and if so, the process goes to block 617 in order to verify that it was or was not the large number of skipped waveform cycles that caused the digital event. If the number of cycles is less than or equal to the predetermined number, it may be just as efficient to re-simulate the skipped waveform cycles using transient simulation so the process goes to blocks 608 and 609.

At process block 619, the number of waveform cycles skipped by the analog solver is reduced to determine if the reduced number of skipped waveforms causes the digital event or not. The number of skipped waveforms may be reduced by a simple numeric factor or by a golden ratio search or a golden section search process, for example. The process then loops back to process block 602 that determines the next analog event time $t_c$ responsive to the reduced number of waveform cycles so that the analog simulation can be performed before the digital event caused by the analog output Vout.

As described previously with reference to process block 617, if the number of cycles skipped is less than or equal to three, the process goes to block 608.

At process block 608, given that the number of cycles skipped is less than or equal to three and a new digital event occurred, the digital event time $t_d$ is updated to be less than or equal to the analog event time $t_c$. The process then goes to block 609 where the analog solver resolves the simulation results of the analog part of the mixed signal RF integrated circuit up to the digital time event $t_d$, as described previously.

The simulation process of the mixed signal RF integrated circuit and the adaptive switching of the analog solver and synchronization with the digital solver continues in a process loop until the digital event time $t_d$ is greater than or equal to the stop time $t_{stop}$, as previously described with reference to block 611. That is, the procedure of FIG. 6 and the synchronizing of the results of the analog solver and the digital solver together is repeated until the final time $t_{stop}$.

Computer System for Use with RF Timing Analysis

Referring now to FIG. 9, a computing system 900 is illustrated that may be used to automate and perform some or all of the processes in accordance with a number of embodiments of the invention. In one embodiment of the invention, the computing system 900 includes a processor 910, a memory 920, a removable media drive 930, and a hard disk drive 940. In one embodiment, the processor 910 executes instructions residing on a machine-readable medium, such as the hard disk drive 940, a removable medium 901 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 920, which may include Random Access Memory (RAM), dynamic RAM (DRAM), etc. The processor 910 may retrieve the instructions from the memory 920 and execute the instructions to perform the operations described above.

Note that any or all of the components and the associated hardware illustrated in FIG. 9 may be used in various embodiments of the system 900. However, it should be appreciated that other configurations of the system 900 may include more or less devices than those shown in FIG. 9.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the desired purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The desired structure for a variety of these systems will appear from the description below. In addition, the embodiments of the invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

CONCLUSION

The RF mixed-signal simulator has the capacity and speed to simulate large RF integrated circuits and RF mixed signal integrated circuits. The RF timing simulator partitions the circuit into two subcircuits, one that contains continuous-time components and one that contains event-driven components. It then simulates those subcircuits using suitable techniques according to the type of descriptions used to represent each component. For the continuous-time components, the RF mixed-signal simulator may apply either traditional transient analysis methods, such as found in SPICE, or special RF simulation methods such as envelope analysis.

When implemented in software, the elements of the embodiments of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

The embodiments of the invention are thus described. While embodiments of the invention have been particularly described, it is to be understood that such embodiments are merely illustrative of and not restrictive on the broad invention, and that the embodiments of the invention not be limited to the specific constructions and arrangements shown and described. Instead, the embodiments of the invention should be construed according to the claims that follow below.

What is claimed is:

1. A method of simulating a mixed signal circuit comprising:

performing a digital simulation of a digital circuit of the mixed signal circuit and an analog simulation of an analog circuit of the mixed signal circuit, wherein the analog circuit is coupled to the digital circuit;
   determining a digital event time for a digital event in the simulation of the digital circuit;
   determining an analog event time for an analog event in the simulation of the analog circuit of the mixed signal circuit, wherein the analog simulation of the analog circuit is performed up to the analog event time, wherein the analog event occurs at an end of an envelope waveform during the analog simulation of the analog circuit;
   comparing the digital event time and the analog event time to determine if the analog event time is later than the digital event time; and
   wherein the analog event time is later than the digital event time and the method further includes
      resolving simulation results of the analog simulation of the analog circuit up to the digital event time,
      synchronizing the analog simulation of the analog circuit with the digital simulation of the digital circuit up to the digital event time, and
      accepting and saving results of the analog simulation and the digital simulation at the digital event time;
   wherein one or more of the determining a digital event time, performing a digital simulation, determining an analog event time, performing an analog simulation, comparing the digital event time and the analog event time, resolving the analog simulation, synchronizing the analog simulation, and accepting and saving results are performed with a processor.

2. A method of simulating a mixed signal circuit comprising:
   performing a digital simulation of a digital circuit of the mixed signal circuit and an analog simulation of an analog circuit of the mixed signal circuit, wherein the analog circuit is coupled to the digital circuit;
   determining a digital event time for a digital event in the simulation of the digital circuit;
   determining an analog event time for an analog event in the simulation of the analog circuit of the mixed signal circuit, wherein the analog simulation of the analog circuit is performed up to the analog event time, wherein the analog event occurs at an end of an envelope waveform during the analog simulation of the analog circuit;
   comparing the digital event time and the analog event time to determine if the analog event time is later than the digital event time; and
   wherein the analog event time is earlier than the digital event time and the method further includes
      pre-accepting results of the analog simulation at the analog event time,
      coupling results for analog outputs of the analog circuit from the analog simulation into the digital simulation of the digital circuit at the analog event time, and
      determining if the results of the analog outputs coupled into the digital simulation cause a new digital event in the digital circuit to occur at the analog event time.

3. The method of simulating of claim 2, wherein
a new digital event occurs at the analog event time and the method further includes
   determining if envelope simulation was used to perform analog simulation of an envelope waveform and if a skipped number of cycles in the envelope waveform exceeds a predetermined number.

4. The method of simulating of claim 3, wherein
envelope simulation was used to perform analog simulation and the skipped number of cycles in the envelope waveform is less than or equal to the predetermined number and the method further includes
   updating the digital event time to be less than or equal to the analog event time, and
   resolving simulation results of an analog simulation of the analog circuit up to the digital event time,
   synchronizing the analog simulation of the analog circuit with a digital simulation of the digital circuit at the digital event time, and
   accepting and saving results of the analog simulation and the digital simulation at the digital event time.

5. The method of simulating of claim 3, wherein
envelope simulation was used to perform analog simulation and the skipped number of cycles in the envelope waveform is greater than the predetermined number and the method further includes
   reducing the skipped number of cycles in the envelope waveform,
   calculating a new analog event time in response to the reduced skipped number of cycles; and
   performing an analog simulation of the analog circuit up to the new analog event time.

6. The method of simulating of claim 3, wherein
transient simulation was used to perform analog simulation and the method further includes
   updating the digital event time to be less than or equal to the analog event time, and
   resolving simulation results of the transient simulation of the analog circuit up to the digital event time,
   synchronizing the analog simulation of the analog circuit with a digital simulation of the digital circuit at the digital event time, and
   accepting and saving results of the analog simulation and the digital simulation at the digital event time.

7. The method of simulating of claim 3, further comprising:
   determining that the new digital event time exceeds a stop time; and
   ending the simulating of the mixed signal circuit.

8. A computer readable storage medium having computer readable program instructions stored thereon that when executed by a processor performs operations comprising:
   performing a digital simulation of a digital circuit of the mixed signal circuit and an analog simulation of an analog circuit of the mixed signal circuit, wherein the analog circuit is coupled to the digital circuit;
   determining a digital event time for a digital event in the simulation of the digital circuit;
   determining an analog event time for an analog event in the simulation of the analog circuit of the mixed signal circuit, wherein the analog simulation of the analog circuit is performed up to the analog event time, wherein the analog event occurs at an end of an envelope waveform during the analog simulation of the analog circuit;
   comparing the digital event time and the analog event time to determine if the analog event time is later than the digital event time; and
   wherein the analog event time is later than the digital event time and the method further includes
      resolving simulation results of the analog simulation of the analog circuit up to the digital event time,
      synchronizing the analog simulation of the analog circuit with the digital simulation of the digital circuit up to the digital event time, and
      accepting and saving results of the analog simulation and the digital simulation at the digital event time.

9. A computer readable storage medium having computer readable program instructions stored thereon that when executed by a processor performs operations comprising:

performing a digital simulation of a digital circuit of the mixed signal circuit and an analog simulation of an analog circuit of the mixed signal circuit, wherein the analog circuit is coupled to the digital circuit;

determining a digital event time for a digital event in the simulation of the digital circuit-of the mixed signal circuit;

performing the digital simulation of the digital circuit up to the digital event time;

determining an analog event time for an analog event in the simulation of the analog circuit of the mixed signal circuit, wherein the analog simulation of the analog circuit is performed up to the analog event time, wherein the analog event occurs at an end of an envelope waveform during the analog simulation of the analog circuit;

comparing the digital event time and the analog event time to determine if the analog event time is later than the digital event time; and wherein the analog event time is earlier than the digital event time and the processor performs further operations including accepting results of the analog simulation at the analog event time, coupling results for analog outputs of the analog circuit from the analog simulation into the digital simulation at the analog event time, and determining if the results of the analog outputs coupled into the digital simulation cause a new digital event in the digital circuit to occur at the analog event time.

10. The computer readable storage medium of claim 9, wherein a new digital event occurs at the analog time event and the processor performs the further operation of determining if envelope simulation was used to perform analog simulation of an envelope waveform and if a skipped number of cycles in the envelope waveform exceeds a predetermined number.

11. The computer readable storage medium of claim 10, wherein envelope simulation was used to perform analog simulation and the skipped number of cycles in the envelope waveform is less than or equal to the predetermined number and the processor performs further operations including updating the digital event time to be less than or equal to the analog event time, and resolving simulation results of an analog simulation of the analog circuit up to the digital event time, synchronizing the analog simulation of the analog circuit with a digital simulation of the digital circuit at the digital event time, and accepting and saving results of the analog simulation and the digital simulation at the digital event time.

12. The computer readable storage medium of claim 10, wherein envelope simulation was used to perform analog simulation and the skipped number of cycles in the envelope waveform is greater than the predetermined number and the processor performs further operations including reducing the skipped number of cycles in the envelope waveform, calculating an analog event time in response to the reduced skipped number of cycles; and performing an analog simulation of the analog circuit up to the new analog event time.

13. The computer readable storage medium of claim 10, wherein transient simulation was used to perform analog simulation and the processor performs further operations including updating the digital event time to be less than or equal to the analog event time, and resolving simulation results of the transient simulation of the analog circuit up to the digital event time, synchronizing the analog simulation of the analog circuit with a digital simulation of the digital circuit at the digital event time, and accepting and saving results of the analog simulation and the digital simulation at the digital event time.

14. The computer readable storage medium of claim 10, wherein the processor performs further operations including determining the new digital event time exceeds a stop time; and ending the simulating of the mixed signal circuit.

15. The method of simulating of claim 2, wherein no new digital event occurs at the analog time event and the method further includes saving the results of the analog simulation at the analog event time.

16. The computer readable storage medium of claim 9, wherein no new digital event occurs at the analog time event and the processor performs the further operation of saving the results of the analog simulation at the analog event time.

17. The method of simulating of claim 1, wherein the digital event is a change in a digital signal that is coupled into the analog circuit; and the analog event is an abrupt change in an analog signal.

18. The method of simulating of claim 1, wherein the digital event time and the analog event time are along a simulation time line for the digital and analog simulations.

19. The method of simulating of claim 1, wherein the resolving of the simulation results of the analog simulation includes discarding a solution for the analog circuit at a current time point, reducing a time step associated with resolving simulation results of the analog simulation, and re-simulating the analog circuit to obtain simulation results.

20. The method of simulating of claim 1, wherein the resolving of the simulation results of the analog simulation includes rolling back the analog simulation along a simulation time line to a simulation time before the digital event time, and performing a transient simulation to generate simulation results for the analog circuit from the simulation time before the digital event time up to the digital event time.

21. The method of simulating of claim 20, wherein the resolving of the simulation results of the analog simulation further includes interpolating an envelope simulation at an interpolation time point for a simulation solution just before the digital event time, and performing the transient simulation from the interpolation time point to generate simulation results for the analog circuit from the interpolation time point up to the digital event time.

22. The method of simulating of claim 2, wherein
the digital event is a change in a digital signal that is coupled into the analog circuit; and
the analog event is an abrupt change in an analog signal.

23. The method of simulating of claim 2, wherein
the digital event time and the analog event time are along a simulation time line for the digital and analog simulations.

24. The computer readable storage medium of claim 8, wherein
the digital event is a change in a digital signal that is coupled into the analog circuit; and
the analog event is an abrupt change in an analog signal.

25. The computer readable storage medium of claim 8, wherein
the digital event time and the analog event time are along a simulation time line for the digital and analog simulations.

26. The computer readable storage medium of claim 8, wherein
the resolving of the simulation results of the analog simulation includes
discarding a solution for the analog circuit at a current time point,
reducing a time step associated with resolving simulation results of the analog simulation, and
re-simulating the analog circuit to obtain simulation results.

27. The computer readable storage medium of claim 8, wherein
the resolving of the simulation results of the analog simulation includes
rolling back the analog simulation along a simulation time line to a simulation time before the digital event time, and
performing a transient simulation to generate simulation results for the analog circuit from the simulation time before the digital event time up to the digital event time.

28. The computer readable storage medium of claim 27, wherein
the resolving of the simulation results of the analog simulation further includes
interpolating an envelope simulation at an interpolation time point for a simulation solution just before the digital event time, and
performing the transient simulation from the interpolation time point to generate simulation results for the analog circuit from the interpolation time point up to the digital event time.

29. The computer readable storage medium of claim 9, wherein
the digital event is a change in a digital signal that is coupled into the analog circuit; and
the analog event is an abrupt change in an analog signal.

30. The computer readable storage medium of claim 9, wherein
the digital event time and the analog event time are along a simulation time line for the digital and analog simulations.

* * * * *